United States Patent
Lee et al.

(10) Patent No.: US 7,994,525 B2
(45) Date of Patent: *Aug. 9, 2011

(54) NITRIDE-BASED SEMICONDUCTOR LIGHT EMITTING DIODE

(75) Inventors: Hyuk Min Lee, Seoul (KR); Hyun Kyung Kim, Suwon (KR); Dong Joon Kim, Suwon (KR); Hyoun Soo Shin, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/967,558

(22) Filed: Dec. 14, 2010

(65) Prior Publication Data

US 2011/0084305 A1    Apr. 14, 2011

Related U.S. Application Data

(60) Continuation of application No. 12/153,842, filed on May 27, 2008, now Pat. No. 7,893,447, which is a division of application No. 11/543,798, filed on Oct. 6, 2006.

(30) Foreign Application Priority Data

Oct. 7, 2005 (KR) .................. 10-2005-0094453

(51) Int. Cl.
*H01L 33/06* (2010.01)

(52) U.S. Cl. ...... 257/94; 257/13; 257/103; 257/E33.025; 257/E33.03; 257/E33.034; 257/E33.062; 257/E33.063

(58) Field of Classification Search ............. 257/13, 257/94, 103, E33.025, E33.03, E33.034, 257/E33.062, E33.063
See application file for complete search history.

(56) References Cited

U.S. PATENT DOCUMENTS

| | | | |
|---|---|---|---|
| 5,652,434 A | | 7/1997 | Nakamura et al. |
| 2002/0173062 A1* | | 11/2002 | Chen et al. .............. 438/30 |
| 2003/0047743 A1 | | 3/2003 | Li |

(Continued)

FOREIGN PATENT DOCUMENTS

JP       10-275942       10/1998

(Continued)

OTHER PUBLICATIONS

United States Office Action issued in U.S. Appl. No. 11/543,798 dated May 20, 2010.

(Continued)

*Primary Examiner* — Kiesha R Bryant
*Assistant Examiner* — Minchul Yang
(74) *Attorney, Agent, or Firm* — McDermott Will & Emery LLP

(57) ABSTRACT

A nitride-based semiconductor LED includes a substrate; an n-type nitride semiconductor layer formed on the substrate; an active layer and a p-type nitride semiconductor layer that are sequentially formed on a predetermined region of the n-type nitride semiconductor layer; a transparent electrode formed on the p-type nitride semiconductor layer; a p-electrode pad formed on the transparent electrode, the p-electrode pad being spaced from the outer edge line of the p-type nitride semiconductor layer by 50 to 200 μm; and an n-electrode pad formed on the n-type nitride semiconductor layer.

10 Claims, 6 Drawing Sheets
(1 of 6 Drawing Sheet(s) Filed in Color)

U.S. PATENT DOCUMENTS

2003/0107053 A1    6/2003    Uemura et al.

FOREIGN PATENT DOCUMENTS

| | | |
|---|---|---|
| JP | 10-303460 | 11/1998 |
| JP | 2001-345480 | 12/2001 |
| JP | 2003-046127 | 2/2003 |
| JP | 2003-282945 | 10/2003 |
| JP | 2005-116997 | 4/2005 |
| JP | 2005-260244 | 9/2005 |
| KR | 10-2004-0104265 | 12/2004 |
| KR | 1020050063924 | 6/2005 |
| KR | 10-0506740 | 8/2005 |

OTHER PUBLICATIONS

Japanese Office Action issued in Japanese Patent Application No. JP 2008-165819 dated Aug. 31, 2010.

Japanese Office Action issued in Japanese Patent Application No. JP 2008-13290 dated Jun. 9, 2009.

Japanese Office Action issued in Japanese Patent Application No. JP 2006-273878 dated Jul. 17, 2007.

Japanese Office Action issued in Japanese Patent Application No. JP 2008-13290 dated Mar. 2, 2010.

Japanese Office Action issued in Japanese Patent Application No. JP 2008-13290 dated Feb. 16, 2010.

Japanese Office Action issued in Japanese Patent Application No. JP 2006-273878 dated Feb. 20, 2008.

Japanese Appeal Decision, w/ English translation thereof, issued in Japanese Patent Application No. JP 2008 dated Aug. 10, 2010.

United States Notice of Allowance issued in U.S. Appl. No. 11/543,798 dated Jan. 18, 2011.

\* cited by examiner

[FIG. 1]
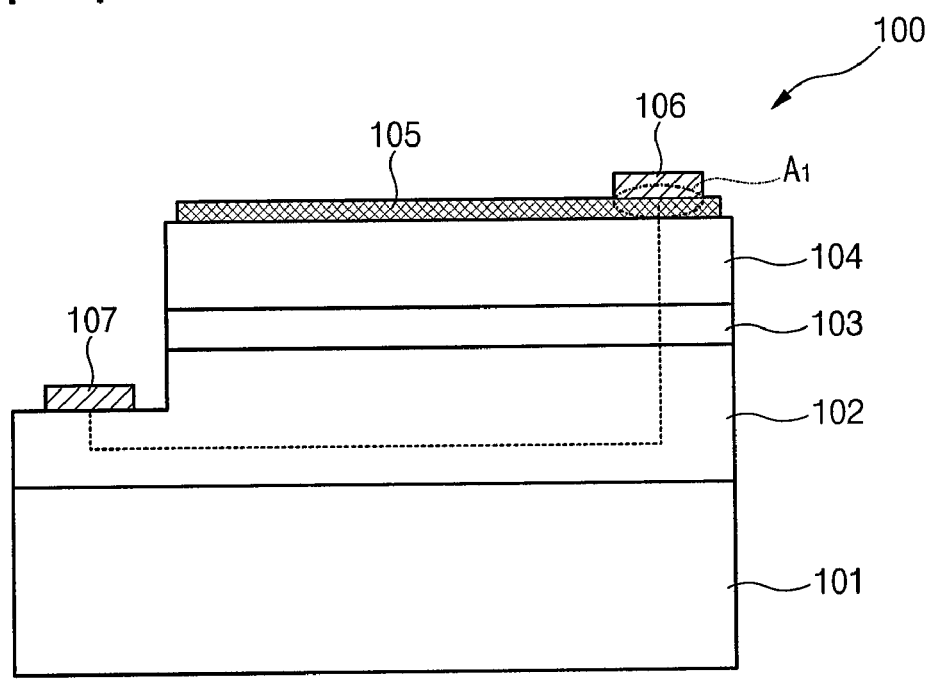
[FIG. 2]
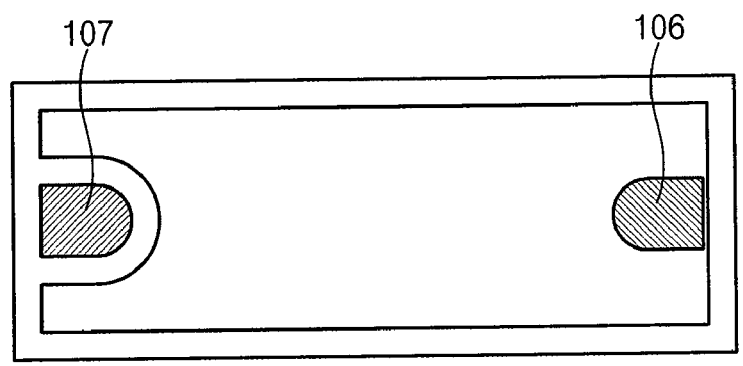

[FIG. 3]
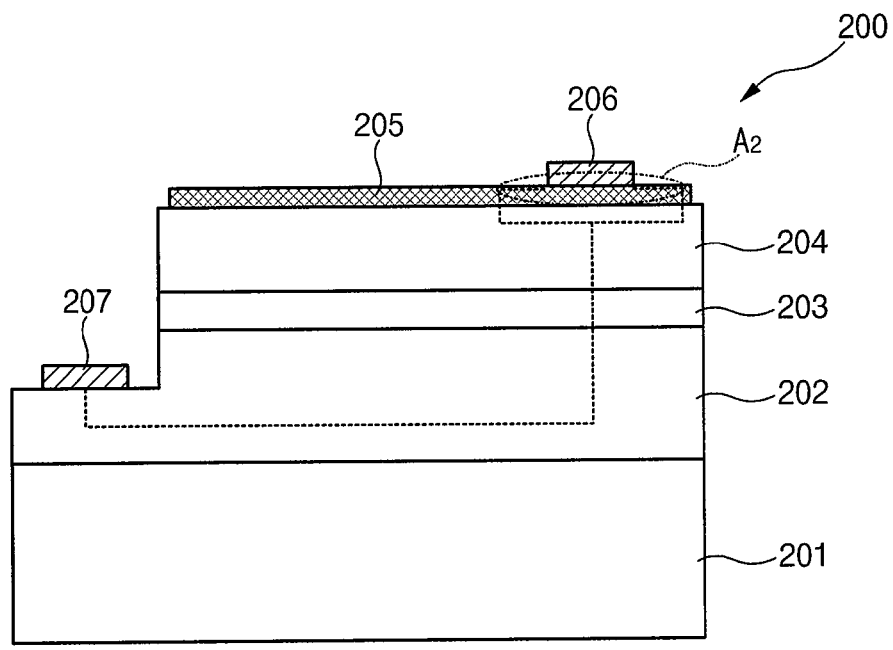
[FIG. 4]
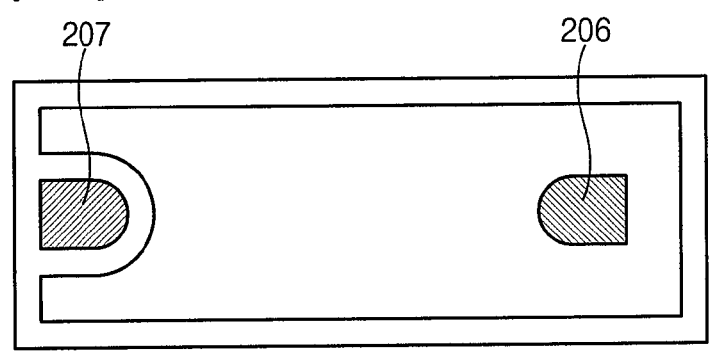
[FIG. 5A]
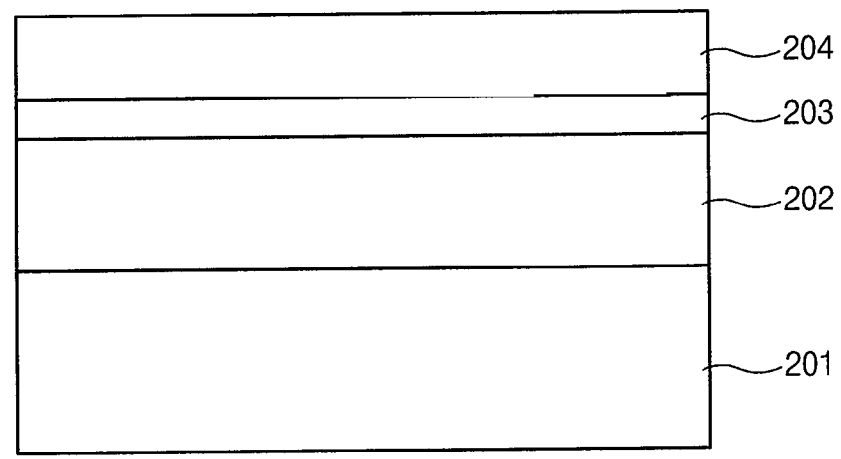

[FIG. 5B]
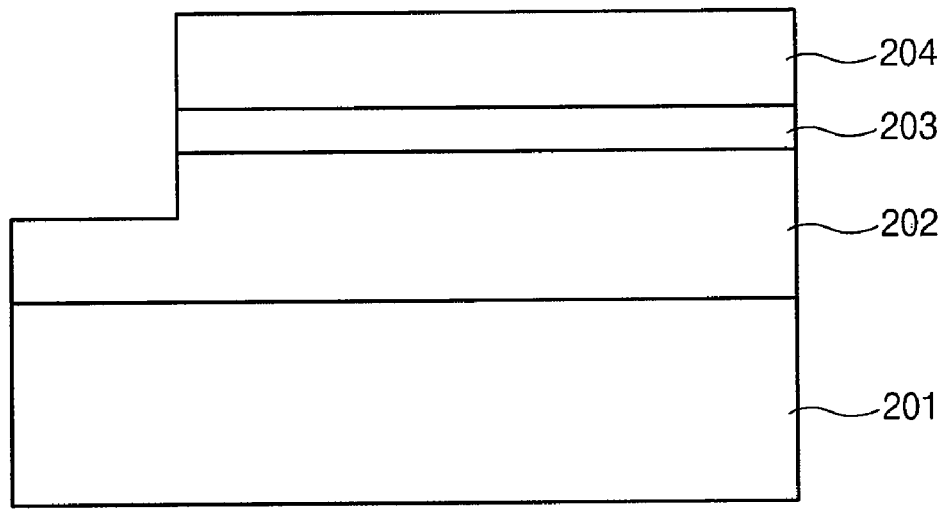
[FIG. 5C]
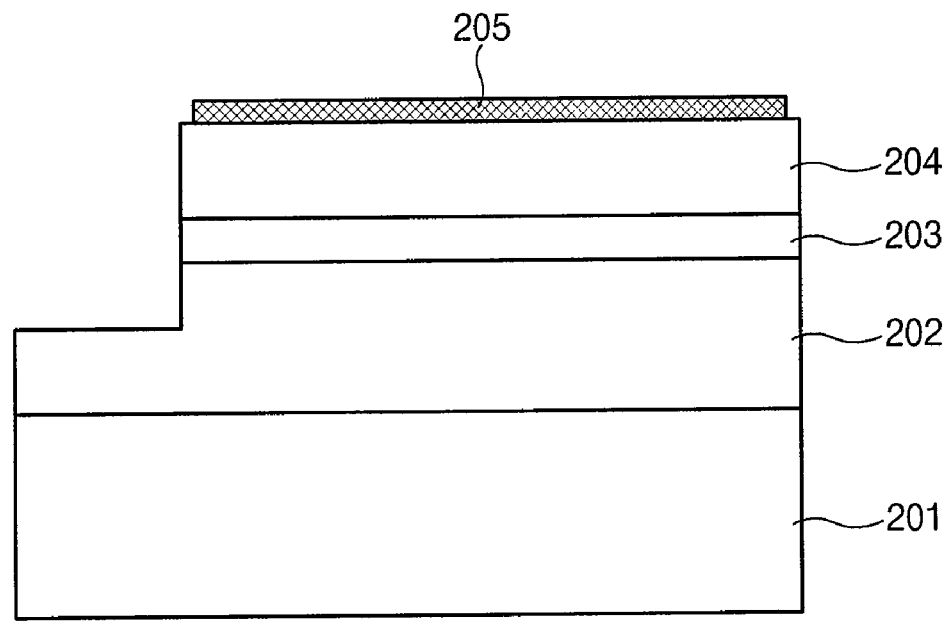

[FIG. 5D]
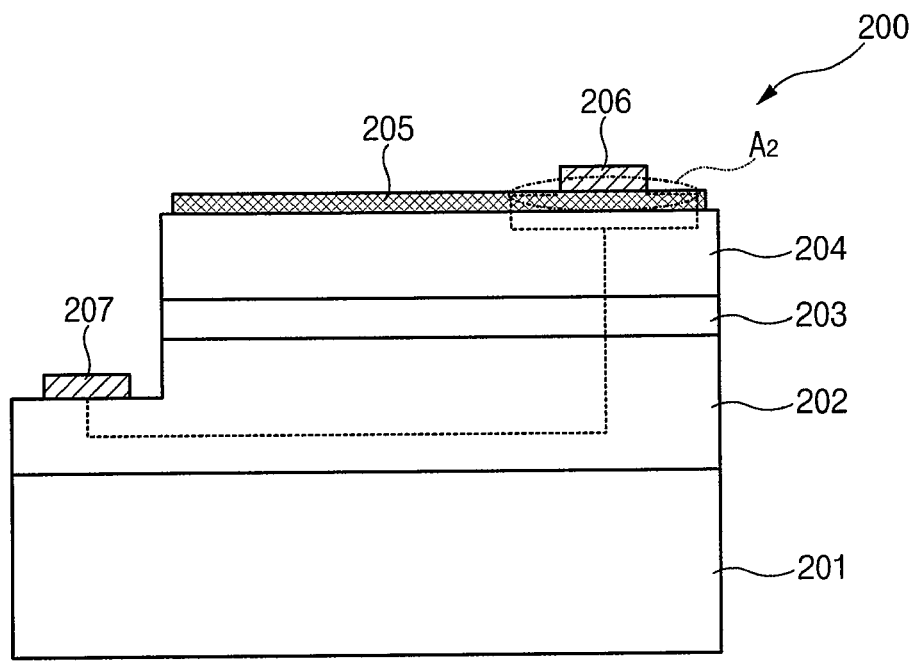
[FIG. 6]
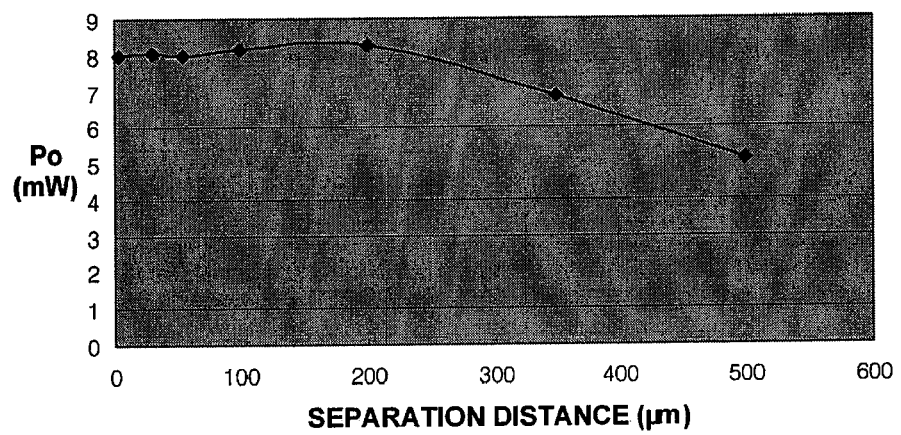

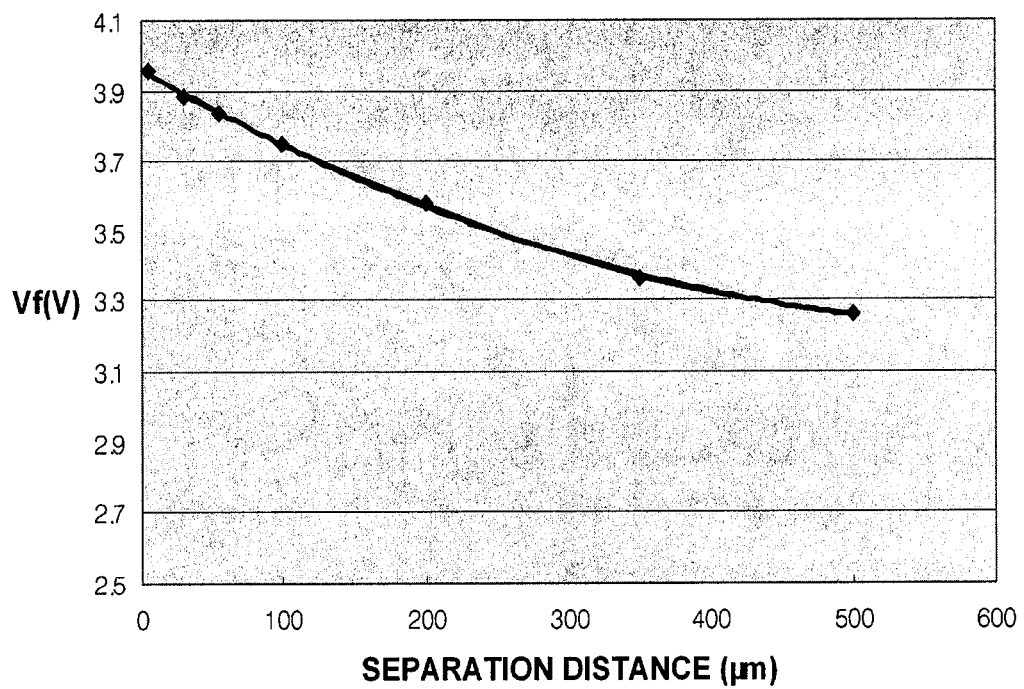
[FIG. 7]

NITRIDE-BASED SEMICONDUCTOR LIGHT EMITTING DIODE

CROSS-REFERENCE TO RELATED APPLICATIONS

This application is a Continuation of U.S. patent application Ser. No. 12/153,842, filed on May 27, 2008, now U.S. Pat. No. 7,893,447 which is a Divisional of U.S. patent application Ser. No. 11/543,798, filed Oct. 6, 2006, and claims the benefit of Korean Patent Application No. 2005-94453 filed with the Korea Industrial Property Office on Oct. 7, 2005, the disclosures of each of which are incorporated herein by reference.

BACKGROUND OF THE INVENTION

1. Field of the Invention

The present invention relates to a nitride-based semiconductor light emitting diode (LED). In the nitride-based semiconductor LED, an area around a p-electrode pad, in which light is preferentially emitted, is expanded so as to enhance light extraction efficiency, and local current crowding is prevented so as to reduce a driving voltage.

2. Description of the Related Art

Because group III-V nitride semiconductors such as GaN have excellent physical and chemical properties, they are considered as essential materials of light emitting devices, for example, light emitting diodes (LEDs) or laser diode (LDs). The LEDs or LDs formed of the group III-V nitride semiconductors are widely used in the light emitting devices for obtaining blue or green light. The light emitting devices are applied to light sources of various products, such as household appliances, electronic display boards, and lighting devices. Generally, the group III-V nitride semiconductors are comprised of gallium nitride (GaN) based materials having an compositional formula of $In_XAl_YGa_{1-X-Y}N$ ($0 \leq X$, $0 \leq Y$, $X+Y \leq 1$).

Hereinafter, a conventional nitride-based semiconductor LED will be described in detail with reference to FIGS. 1 and 2.

FIG. 1 is a sectional view illustrating the conventional nitride-based semiconductor LED, and FIG. 2 is a plan view illustrating the conventional nitride-based semiconductor LED.

As shown in FIG. 1, the nitride-based semiconductor LED 100 includes a sapphire substrate 101 for growing nitride-based semiconductor materials, an n-type nitride semiconductor layer 102, an active layer 103, and a p-type nitride semiconductor layer 104, which are sequentially formed on the sapphire substrate 101. Portions of the p-type nitride semiconductor layer 104 and the active layer 103 are removed by a mesa etching process, so that the n-type nitride semiconductor layer 102 is partially exposed.

On the p-type nitride semiconductor layer 104 which has not been etched by the mesa etching process, a p-electrode pad 106 is formed. On the n-type nitride semiconductor layer 102, an n-electrode pad 107 is formed.

Since the p-type nitride semiconductor layer 104 has larger specific resistance than the n-type nitride semiconductor layer 102, a difference in resistance between the p-type nitride semiconductor layer 104 and the n-type nitride semiconductor layer 102 causes a current spreading effect to be reduced. As such, when a current spreading effect decreases, light extraction efficiency also decreases so that the brightness of the nitride semiconductor LED 100 is reduced. Accordingly, in order to enhance a current spreading effect in the related art, a transparent electrode 105 is formed on the p-type nitride semiconductor layer 104 so as to increase an injection area of current which is injected through the p-electrode pad 106.

In the above-described nitride-based semiconductor LED 100, the transparent electrode 105 is further provided on the p-type nitride semiconductor 104 so as to obtain an enhanced current spreading effect. However, when a difference in surface resistance between the transparent electrode 105 and the n-type nitride semiconductor layer 102 is large, a current spreading effect is still small. For example, when a commonly-used ITO (indium tin oxide) is used as the transparent electrode 105, local current crowding occurs in the vicinity (refer to reference numeral 'A$_1$') of the p-electrode pad because of high surface resistance of the ITO.

In the nitride-based semiconductor LED 100, the p-electrode pad 106 is formed as close to the outer edge line of the p-type nitride semiconductor layer 104 as possible, the outer edge line being a mesa line. Further, the p-electrode pad 106 and the n-electrode 107 is spaced at the maximum distance from each other so as to secure the maximum light emitting area therebetween. Then, an optical output is expected to be enhanced. In this case, however, local current crowding increases in the vicinity (A$_1$) of the p-electrode pad 106, thereby degrading the reliability of the diode.

The vicinity (A$_1$) of the p-electrode pad 106 is a region (hereinafter, referred to as 'preferential light emission region') in which light is preferentially emitted. When the p-electrode pad 106 is formed close to the mesa line, there is a limit in securing an area in the vicinity (A$_1$) of the p-electrode pad 106 which is a preferential light-emission region of which the luminous density is high. Such a limit makes it difficult to enhance the light extraction efficiency of the entire chip. In the meantime, a dotted line of FIG. 1 represents a current path.

SUMMARY OF THE INVENTION

An advantage of the present invention is that it provides a nitride-based semiconductor light emitting diode (LED) in which an area around a p-electrode pad is expanded so as to enhance light extraction efficiency, and local current crowding is prevented so as to reduce a driving voltage, in order to enhance the reliability of the diode.

Additional aspect and advantages of the present general inventive concept will be set forth in part in the description which follows and, in part, will be obvious from the description, or may be learned by practice of the general inventive concept.

According to an aspect of the invention, a nitride-based semiconductor LED comprises a substrate that is formed in a rectangle shape and of which a ratio of the width and the length is equal to or more than 1.5; an n-type nitride semiconductor layer that is formed on the substrate and is composed of an n-type semiconductor material having a compositional formula of $In_XAl_YGa_{1-X-Y}N$ ($0 \leq X$, $0 \leq Y$, and $X+Y \leq 1$); an active layer and a p-type nitride semiconductor layer that are sequentially formed on a predetermined region of the n-type nitride semiconductor layer, the active layer being composed of a semiconductor material having a compositional formula of $In_XAl_YGa_{1-X-Y}N$ ($0 \leq X$, $0 \leq Y$, and $X+Y \leq 1$) and the p-type nitride semiconductor layer being composed of a p-type semiconductor material having a compositional formula of $In_XAl_YGa_{1-X-Y}N$ ($0 \leq X$, $0 \leq Y$, and $X+Y \leq 1$); a transparent electrode that is formed on the p-type nitride semiconductor layer so as to be spaced at a predetermined distance from the outer edge line of the p-type nitride semiconductor layer; a p-electrode pad that is formed on the transparent electrode so as to be spaced at a distance of 50 to 200 µm from the outer edge line of the p-type nitride semiconductor layer composed of a p-type semiconductor material having a compositional formula of $In_XAl_YGa_{1-X-Y}N$ ($0 \leq X$, $0 \leq Y$, and $X+Y \leq 1$); and an n-electrode pad that is formed on the n-type nitride semiconductor layer.

The nitride-based semiconductor LED further comprises a buffer layer that is formed between the substrate and the n-type nitride semiconductor layer and is composed of AlN/GaN. The substrate is a sapphire substrate.

Preferably, the n-type nitride semiconductor layer is a GaN layer or GaN/AlGaN layer doped with any one n-type conductive impurity selected from the group consisting of Si, Ge, and Sn, the p-type nitride semiconductor layer is a GaN layer or GaN/AlGaN layer doped with any one p-type conductive impurity selected from the group consisting of Mg, Zn, and Be, and the active layer is composed of an InGaN/GaN layer with a multi-quantum well structure.

Preferably, the transparent electrode is an ITO (Indium Tin Oxide) material.

Preferably, the p-electrode pad and the n-electrode pad are formed of Au or Au/Cr.

When the p-electrode pad is spaced at a distance of 50 to 200 µm from the outer edge line of the p-type nitride semiconductor layer, optical power may increase.

When the p-electrode pad is spaced at a distance of more than 200 µm from the outer edge line of the p-type nitride semiconductor layer, optical power may decrease.

BRIEF DESCRIPTION OF THE DRAWINGS

The patent or application file contains at least one drawing executed in color. Copies of this patent or patent application publication with color drawings will be provided by the Office upon request and payment of the necessary fee.

These and/or other aspects and advantages of the present general inventive concept will become apparent and more readily appreciated from the following description of the embodiments, taken in conjunction with the accompanying drawings of which:

FIG. 1 is a sectional view illustrating a conventional nitride-based semiconductor LED;

FIG. 2 is a plan view illustrating the conventional nitride-based semiconductor LED;

FIG. 3 is a sectional view illustrating a nitride-based semiconductor LED according to an embodiment of the present invention;

FIG. 4 is a plan view illustrating the nitride-based semiconductor LED according to the embodiment of the invention;

FIGS. 5A to 5D are sectional views for explaining a method of manufacturing the nitride-based semiconductor LED according to an embodiment of the invention;

FIG. 6 is a graph illustrating a change in Po (optical power) in accordance with a separation distance of a p-electrode pad;

FIG. 7 is a graph illustrating a change in a driving voltage in accordance with a separation distance of the p-electrode pad.

DETAILED DESCRIPTION OF THE PREFERRED EMBODIMENTS

Figure 8:
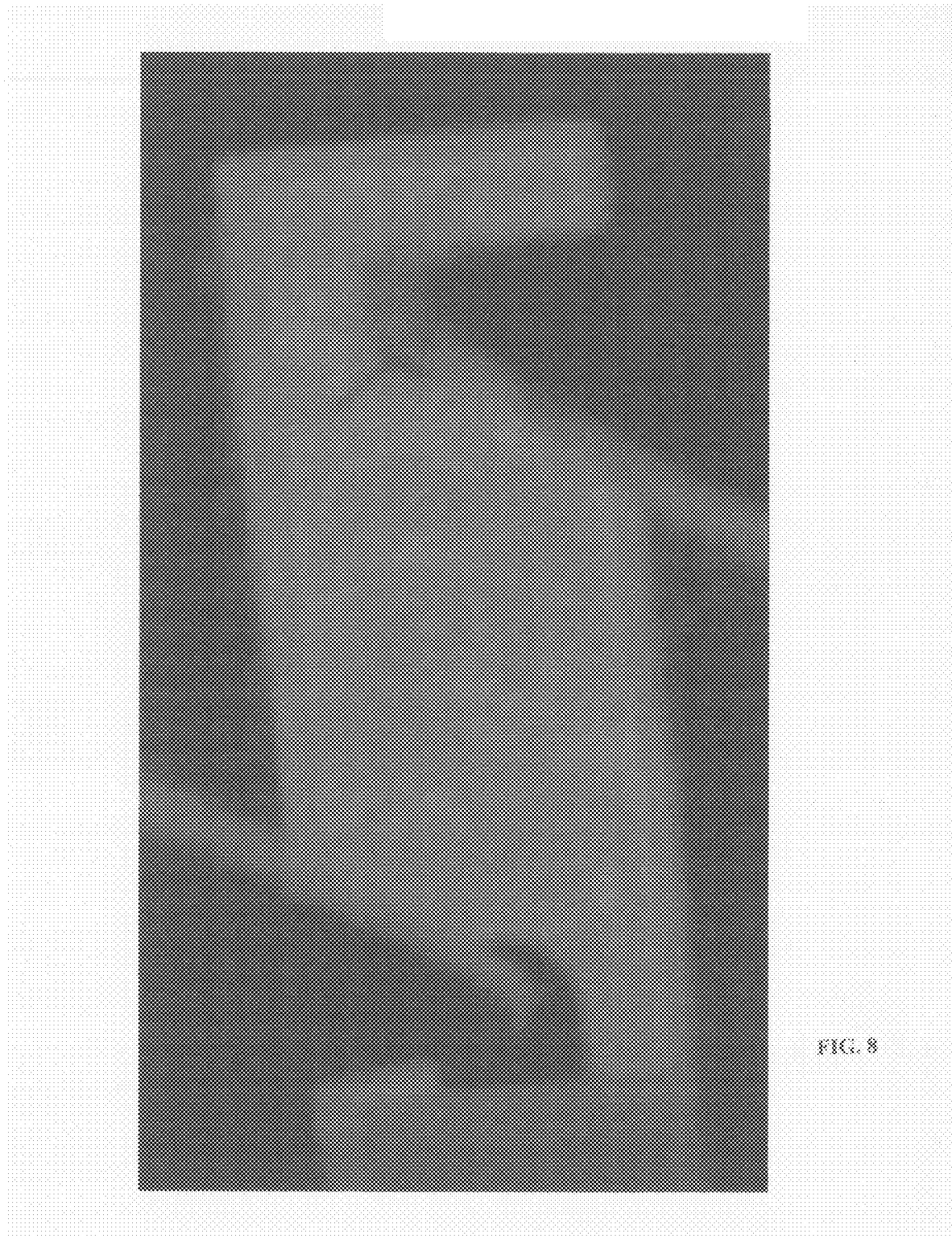
FIG. 8 is a color photograph showing a state where the p-electrode pad is spaced from a mesa-line by 55 µm.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, preferred embodiments of the present invention will be described in detail with reference to the accompanying drawings.

Structure of Nitride-Based Semiconductor LED

Referring to FIGS. 3 and 4, a nitride-based semiconductor LED according to an embodiment of the invention will be described in detail.

FIG. 3 is a sectional view illustrating the nitride-based semiconductor LED, and FIG. 4 is a plan view illustrating the nitride-based semiconductor LED.

As shown in FIG. 3, the nitride-based semiconductor LED 200 according to the embodiment of the invention includes a sapphire substrate 201 for growing nitride-based semiconductor materials, a buffer layer (not shown), an n-type nitride semiconductor layer 202, an active layer 203, and a p-type nitride semiconductor layer 204, which are sequentially formed on the sapphire substrate 201. Portions of the p-type nitride semiconductor layer 204 and the active layer 203 are removed by a mesa etching process, so that the upper surface of the n-type nitride semiconductor layer 202 is partially exposed.

The buffer layer is grown on the sapphire substrate 201 so as to enhance the lattice matching between the sapphire substrate 210 and the n-type nitride semiconductor layer 202. The buffer layer may be formed of AlN/GaN or the like.

The n-type and p-type nitride semiconductor layers 202 and 204 and the active layer 203 can be formed of a semiconductor material having a compositional formula of $In_XAl_YGa_{1-X-Y}N$ (here, $0 \leq X$, $0 \leq Y$, and $X+Y \leq 1$). More specifically, the n-type nitride semiconductor layer 202 can be formed of a GaN or GaN/AlGaN layer doped with n-type conductive impurities. For example, the n-type conductive impurity may be Si, Ge, Sn and the like, among which Si is preferably used. Further, the p-type nitride semiconductor layer 204 can be formed of a GaN or GaN/AlGaN layer doped with p-type conductive impurities. For example, the p-type conductive impurity may be Mg, Zn, Be and the like, among which Mg is preferably used. The active layer 203 can be formed of an InGaN/GaN layer with a multi-quantum well structure.

On the p-type nitride semiconductor layer 204 which has not been removed by the mesa-etching process, a transparent electrode 205 is formed of an ITO material. As shown in FIG. 3, the transparent electrode 205 is spaced at a predetermined distance from the outer edge line of the p-type nitride semiconductor layer 204. On the transparent electrode 205, a p-type electrode pad 206 is formed so as to be spaced at a predetermined distance from the outer edge line of the p-type nitride semiconductor layer 204 which is a mesa line. On the n-type nitride semiconductor layer 202 exposed by the mesa etching process, an n-type electrode pad 207 is formed. At this time, it is preferable that the p-type electrode pad 206 is formed so as to be spaced from the outer edge line of the p-type nitride semiconductor layer 204 by 50 to 200 µm, in consideration of the size of a general nitride-based semiconductor LED chip.

As shown in FIG. 4, the plan shape of the substrate 201 is formed in a rectangle shape. In this case, it is preferable that a ratio of the width to the length of the rectangle is 1:1.5.

In the meantime, when a commonly-used ITO is used as the transparent electrode 205 as described above, local current crowding can occur in the vicinities of the p-type electrode pad 206 because of high surface resistance of the ITO. In this embodiment, however, the p-type electrode pad 206 is spaced at a predetermined distance from the mesa line, which makes it possible to reduce local current crowding. Accordingly, it is possible to enhance the reliability of the diode (for example, a driving voltage can be reduced) and to expand an area around the p-electrode pad 206 which is a preferential light emitting region (refer to reference numeral 'A₂' of FIG. 3). Therefore, it is possible to enhance the overall light emission efficiency of the chip. Meanwhile, a dotted line of FIG. 3 shows a current path.

Method of Manufacturing Nitride-Based Semiconductor LED

Hereinafter, a method of manufacturing a nitride-based semiconductor LED according to an embodiment of the invention will be described.

FIGS. 5A to 5D are sectional views illustrating the method of manufacturing a nitride-based semiconductor LED.

First, as shown in FIG. 5A, a buffer layer (not shown), an n-type nitride semiconductor layer 202, an active layer 203, and a p-type nitride semiconductor layer 204 are sequentially formed on a sapphire substrate 201 for growing nitride-based semiconductor materials. The buffer layer may be omitted, and the n-type nitride semiconductor layer 202, the active layer 203, and the p-type nitride semiconductor layer 203 can be formed of a semiconductor material having a compositional formula of $In_XAl_YGa_{1-X-Y}N$ (here, $0 \leq X$, $0 \leq Y$, and $X+Y \leq 1$). In general, they may be formed through such a process as a metal organic chemical vapor deposition (MOCVD) method.

Next, as shown in FIG. 5B, portions of the p-type nitride semiconductor layer 204, the active layer 203, and the n-type nitride semiconductor layer 202 are mesa-etched so as to partially expose the n-type nitride semiconductor layer 202.

As shown in FIG. 5C, a transparent electrode 205 is formed on the p-type nitride semiconductor layer 204. In general, the transparent electrode 205 is formed of an ITO.

As shown in FIG. 5D, a p-electrode pad 206 is formed on the transparent electrode 205 spaced at a predetermined distance from the outer edge line of the p-type nitride semiconductor layer 204, and an n-electrode pad 207 is formed on the n-type nitride semiconductor layer 202. The p-electrode pad 206 and the n-electrode pad 207 may be formed of metal such as Au or Au/Cr.

As described above, current crowding can occur in the vicinities of the p-electrode pad 206 because of high surface resistance of an ITO used as the transparent electrode 205. In this embodiment, however, the p-electrode pad 206 is spaced at a predetermined distance from the mesa line, which makes it possible to reduce local current crowding. Therefore, a driving voltage can be reduced, and an area around the p-electrode pad 206 which is a preferential light emitting region can be expanded (refer to reference numeral 'A₂' of FIG. 5D), which makes it possible to enhance the overall light emission efficiency of the chip.

FIG. 6 is a graph illustrating a change in Po (optical power) in accordance with a separation distance of the p-electrode pad, and FIG. 7 is a graph illustrating a change in a driving voltage in accordance with a separation distance of the p-electrode pad.

Referring to FIG. 6, while the p-electrode pad 206 is spaced from the mesa line by 50 to 200 μm, Po tends to increase. As the p-electrode pad 206 is spaced from the mesa line by more than 200 μm, Po decreases. Therefore, it is most preferable that the p-electrode pad 206 is spaced from the outer edge line of the p-type nitride semiconductor layer 204 as the mesa line by 50 to 200 μm. Further, referring to FIG. 7, as the p-electrode pad 206 is spaced at a predetermined distance from the mesa line, that is, as the distance between the p-electrode pad 206 and the n-electrode pad 207 is reduced, a driving voltage is reduced.

FIG. 8 is a color photograph showing a luminous state when the p-electrode pad is spaced from the mesa line by 55 μm.

When the p-electrode pad 206 is spaced from the mesa line by 55 μm, a uniform luminous effect can be obtained in the entire chip, as shown in FIG. 8. Further, an area around the p-electrode pad 206, which is a preferential light emitting region, can be expanded, so that the overall luminous efficiency of the chip can be further enhanced.

Preferably, the plan shape of the sapphire substrate 201 is formed in a rectangle shape. This is because, when the sapphire substrate 201 is rectangular, it is advantageous to secure a margin of distance where the p-electrode pad 206 can be spaced from the mesa line, compare with when the sapphire substrate 201 is formed in a square shape. In this case, it is preferable that a ratio of the width to the length of the rectangle is 1:1.5. This is because, when a ratio of the width to the length of the rectangle is less than 1.5, the p-electrode pad 206 spaced from the mesa line becomes so close to the n-electrode pad 207 that a current spreading effect can be reduced.

According to the nitride-based semiconductor LED and the method of manufacturing the same of the present invention, the p-electrode pad is spaced at a predetermined distance from the mesa line, and an area around the p-electrode pad, in which light is preferentially emitted, is expanded so as to enhance light extraction efficiency of a chip. Further, local current crowding is reduced so as to reduce a driving voltage, thereby enhancing the reliability of the diode.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nitride-based semiconductor LED comprising:
   a substrate that is formed in a rectangle shape and of which a ratio of the width and the length is equal to or more than 1.5;
   an n-type nitride semiconductor layer that is formed on the substrate and is composed of an n-type semiconductor material having a compositional formula of $In_XAl_YGa_{1-X-Y}N (0 \leq X, 0 \leq Y, and X+Y \leq 1)$;
   an active layer and a p-type nitride semiconductor layer that are sequentially formed on a predetermined region of the n-type nitride semiconductor layer, the active layer being composed of a semiconductor material having a compositional formula of $In_XAl_YGa_{1-X-Y}N(0 \leq X, 0 \leq Y, and X+Y \leq 1)$ and the p-type nitride semiconductor layer being composed of a p-type semiconductor material having a compositional formula of $In_XAl_YGa_{1-X-Y}N (0 \leq X, 0 \leq Y, and X+Y \leq 1)$;
   a transparent electrode that is formed on the p-type nitride semiconductor layer;
   a p-electrode pad that is formed on the transparent electrode;
   an n-electrode pad that is formed on the n-type nitride semiconductor layer; and
   a buffer layer that is formed between the substrate and the n-type nitride semiconductor layer,
   wherein the p-electrode pad, devoid of any elongated protrusion or any auxiliary electrode, is spaced at a distance of 50 to 200 μm an outer edge line of the p-type nitride semiconductor layer such that a uniform luminous effect is obtained in the entire LED, and wherein the center of the outer edge line of the p-type nitride semiconductor layer intersects with a straight line that connects a center of the p-electrode pad and a center of the n-electrode pad, and, wherein the n-type semiconductor layer substantially surrounds the n-electrode.

2. The nitride-based semiconductor LED according to claim 1, wherein the n-type nitride semiconductor layer is a GaN layer or GaN/AlGaN layer doped with any one n-type conductive impurity selected from the group consisting of Si, Ge, and Sn, the p-type nitride semiconductor layer is a GaN layer or GaN/AlGaN layer doped with any one p-type conductive impurity selected from the group consisting of Mg, Zn, and Be, and the active layer is composed of an InGaN/GaN layer with a multi-quantum well structure.

3. The nitride-based semiconductor LED according to claim 1, wherein the p-electrode pad and the n-electrode pad are formed of Au or Au/Cr.

4. The nitride-based semiconductor LED according to claim 1, wherein the distance between the p-electrode and the outer edge line of the p-type nitride semiconductor layer is longer that a distance between the n-electrode and another outer edge line of the p-type nitride semiconductor layer.

5. The nitride-based semiconductor LED of claim 1, wherein the buffer layer is composed of AlN/GaN.

6. A nitride-based semiconductor LED comprising:

a substrate that is formed in a rectangle shape and of which a ratio of the width and the length is equal to or more than 1.5;

an n-type nitride semiconductor layer that is formed on the substrate and is composed of an n-type semiconductor material having a compositional formula of $In_XAl_YGa_{1-X-Y}N(0 \leq X, 0 \leq Y, \text{ and } X+Y \leq 1)$;

an active layer and a p-type nitride semiconductor layer that are sequentially formed on a predetermined region of the n-type nitride semiconductor layer, the active layer being composed of a semiconductor material having a compositional formula of $In_XAl_YGa_{1-X-Y}N(0 \leq X, 0 \leq Y, \text{ and } X+Y \leq 1)$ and the p-type nitride semiconductor layer being composed of a p-type semiconductor material having a compositional formula of $In_XAl_YGa_{1-X-Y}N(0 \leq X, 0 \leq Y, \text{ and } X+Y \leq 1)$, the p-type nitride semiconductor layer having a p-electrode pad;

a transparent electrode that is formed on the p-type nitride semiconductor layer;

an n-electrode pad that is formed on the n-type nitride semiconductor layer; and a buffer layer that is formed between the substrate and the n-type nitride semiconductor layer, wherein the p-electrode pad, devoid of any elongated protrusion or any auxiliary electrode, is spaced at a distance of 50 to 200 μm an outer edge line of the p-type nitride semiconductor layer such that a uniform luminous effect is obtained in the entire LED, and wherein the center of the outer edge line of the p-type nitride semiconductor layer intersects with a straight line that connects a center of the p-electrode pad and a center of the n-electrode pad, and wherein the n-type semiconductor layer substantially surrounds the n-electrode.

7. The nitride-based semiconductor LED according to claim 6, wherein the distance between the p-electrode and the outer edge line of the p-type nitride semiconductor layer is longer that a distance between the n-electrode and another outer edge line of the p-type nitride semiconductor layer.

8. The nitride-based semiconductor LED of claim 6, wherein the buffer layer is composed of AlN/GaN.

9. A nitride-based semiconductor LED comprising:

a substrate that is formed in a rectangle shape and of which a ratio of the width and the length is equal to or more than 1.5;

an n-type nitride semiconductor layer that is formed on the substrate and is composed of an n-type semiconductor material having a compositional formula of $In_XAl_YGa_{1-X-Y}N(0 \leq X, 0 \leq Y, \text{ and } X+Y \leq 1)$;

an active layer and a p-type nitride semiconductor layer that are sequentially formed on a predetermined region of the n-type nitride semiconductor layer, the active layer being composed of a semiconductor material having a compositional formula of $In_XAl_YGa_{1-X-Y}N(0 \leq X, 0 \leq Y, \text{ and } X+Y \leq 1)$ and the p-type nitride semiconductor layer being composed of a p-type semiconductor material having a compositional formula of $In_XAl_YGa_{1-X-Y}N(0 \leq X, 0 \leq Y, \text{ and } X+Y \leq 1)$;

a transparent electrode that is formed on the p-type nitride semiconductor layer;

a p-electrode pad that is formed on the transparent electrode, a center of an outer edge line of a p-type nitride semiconductor layer being intersected by a straight line that connects a center of the p-electrode pad and a center of the n-electrode pad, wherein the p-electrode pad is spaced at a distance of 50 to 200 μm from the outer edge line of the p-type nitride semiconductor layer such that a uniform luminous effect is obtained in the entire LED;

an n-electrode pad that is formed on the n-type nitride semiconductor layer; and a buffer layer that is formed between the substrate and the n-type nitride semiconductor layer, wherein the n-type semiconductor layer substantially surrounds the n-electrode.

10. The nitride-based semiconductor LED of claim 9, wherein the buffer layer is composed of AlN/GaN.

* * * * *